United States Patent [19]

Feinberg et al.

[11] Patent Number: 5,500,327

[45] Date of Patent: Mar. 19, 1996

[54] PHOTOSENSITIVE ELEMENT HAVING SUPPORT WITH ADJUSTABLE ADHESION

[75] Inventors: Bernard Feinberg, Englishtown, N.J.; Richard P. Pankratz, Circleville, Ohio

[73] Assignee: E. I. Du Pont de Nemours and Company, Wilmington, Del.

[21] Appl. No.: 432,373

[22] Filed: May 1, 1995

Related U.S. Application Data

[60] Continuation of Ser. No. 371,737, Jan. 12, 1995, abandoned, which is a division of Ser. No. 161,645, Dec. 6, 1993, Pat. No. 5,407,781, which is a division of Ser. No. 860,865, Mar. 31, 1992, Pat. No. 5,292,617.

[51] Int. Cl.$^6$ .............................. G03C 1/492; G03F 7/00
[52] U.S. Cl. .................. 430/306; 430/309; 430/325
[58] Field of Search ................................ 430/306, 309, 430/325, 271, 273

[56] References Cited

U.S. PATENT DOCUMENTS

| | | | |
|---|---|---|---|
| 4,459,348 | 7/1984 | Jun et al. | 430/271 |
| 5,006,447 | 4/1991 | Umeda et al. | 430/272 |
| 5,015,556 | 5/1991 | Martens | 430/306 |
| 5,041,357 | 8/1991 | Gersdorf et al. | 430/277 |
| 5,082,824 | 1/1992 | Rhoades et al. | 428/423.7 |

FOREIGN PATENT DOCUMENTS

| | | |
|---|---|---|
| 0058737A1 | 9/1982 | European Pat. Off. . |
| 0318780A2 | 6/1989 | European Pat. Off. . |
| 416765 | 3/1991 | European Pat. Off. . |
| 432886 | 6/1991 | European Pat. Off. . |
| 0563703A1 | 10/1993 | European Pat. Off. . |
| 0499792 | 8/1992 | Germany . |
| WO92/20011 | 11/1992 | WIPO . |

*Primary Examiner*—Mark Chapman

[57] ABSTRACT

A photosensitive element comprising (a) a support, (b) a thermally hardened layer containing the reaction product of (i) either an organic polymer having reactive segments and nonreactive segments or a blend of organic polymers wherein at least one polymer has reactive segments and at least one polymer has nonreactive segments (ii) a crosslinking agent and (iii) a catalyst and (c) a photohardenable layer is described.

5 Claims, No Drawings

PHOTOSENSITIVE ELEMENT HAVING SUPPORT WITH ADJUSTABLE ADHESION

This is a continuation of application Ser. No. 08/371,737 filed Jan. 12, 1995 now abandoned, which is a divisional application of Ser. No. 08/161,645 filed Dec. 6, 1993 and issued as U.S. Pat. No. 5,407,781, which is a divisional of application Ser. No. 07/860,865 filed Mar. 31, 1992 issued as U.S. Pat. No. 5,292,617.

FIELD OF THE INVENTION

This invention relates to a photosensitive element having a support with adjustable adhesion. More particularly, it relates to a photosensitive element comprising a support and a photosensitive material provided thereon wherein the adhesion of the support to the photosensitive material is initially low and is increased by exposure to actinic radiation.

BACKGROUND OF THE INVENTION

Photosensitive elements are used in a wide variety of applications in the graphic arts and electronics industries. Such elements are used, for example, to prepare printing plates, proofing elements, photoresists, and the like. Photosensitive elements generally comprise a support and a photosensitive layer provided thereon. The element is typically exposed to actinic radiation through a transparency or phototool to produce exposed areas and nonexposed areas. Exposure to actinic radiation results in a change in a physical property of the exposed areas of the photosensitive layer, e.g., a change in solubility, swellability or dispersibility, a change in tackiness, a change in adhesion, a change in color, etc., so that the exposed and nonexposed areas can be differentiated in a subsequent development step. Development may involve (a) removal of the nonexposed areas which are more soluble, swellable or dispersible by applying a suitable solvent to the element, (b) application of a colored toning material which adheres to the more tacky areas, or (c) removal of less adherent material by transfer or peel-apart, etc.

The support in the photosensitive element is generally a thin metal sheet or, more commonly, a flexible, transparent polymeric film, such as polyester. In some applications, the support must remain firmly bonded to the photosensitive material throughout the life of the product, including the development step. In other applications, the support must be removable. In many cases, the desired degree of adhesion is achieved by first coating the film support with an adhesion-adjusting material, i.e., a material which either increases or decreases the adhesion.

There are problems associated with the use of adhesion-adjusting materials. For example, frequently it is difficult to obtain an adhesive material which bonds firmly to both the support and to the overlying photosensitive layer. In some cases, the adhesive is subject to solvent attack so that the initially high adhesion to the support is significantly reduced when the photosensitive layer is applied as a solvent coating. Similarly, there are problems with existing materials which decrease adhesion. For example, it is difficult to obtain a material which bonds firmly to the support, but releasably to the overlying photosensitive layer. Silicone release layers are commonly used with polyester supports, however, on occasion, some silicone material remains on the back side of the overlying layer when it is peeled off the polyester support.

European Patent application 416,765 A2 published Mar. 13, 1991, describes a release film comprising a polymeric film substrate and a polymeric abherent layer. The abherent layer comprises a polyurethane resin which is the reaction product of (i) an organic polyisocyanate (ii) an isocyanate-reactive polydialkyl siloxane and (iii) a polymeric polyol. The abherent layer adheres firmly to the film Substrate but provides release from an opposing surface.

It is desirable to obtain a film support that has adjustable adhesion, i.e., a film support which can be easily removed from the photosensitive layer or remain firmly adhered to the photosensitive layer, depending on the final use. A film support having adjustable adhesion is particularly desirable for photosensitive elements which are used to make relief images for printing plates. A need also exists for a film support that overcomes the disadvantages associates with the use of conventional adhesion-adjusting materials.

These needs are met using the photosensitive element of the invention.

SUMMARY OF THE INVENTION

The present invention provides a photosensitive element comprising in order:

(A) a support;

(B) a thermally hardened layer containing the reaction product of (i) either an organic polymer having reactive segments and nonreactive segments or a blend of organic polymers wherein at least one polymer has reactive segments and at least one polymer has nonreactive segments (ii) a crosslinking agent and (iii) a catalyst; and (C) a photohardenable layer.

The adhesion of the photohardenable layer to the thermally hardened layer is initially low and is increased predictably by exposing the photosensitive element to actinic radiation through the support.

DETAILED DESCRIPTION

The photosensitive element of the invention comprises in order, a support, a thermally hardened layer, and a photohardenable layer. The thermally hardened layer contains a polymeric material or a blend of polymers with reactive segments having strong adhesive properties as well as nonreactive segments having low adhesive properties.

Surprisingly and unexpectedly, it was found that a photosensitive element comprising a support and a layer containing a polymeric material having reactive segments and nonreactive segments provided thereon, results in adjustable adhesion between the support and the photohardenable layer. The adhesion of the photosensitive layer to the support is initially low, but sufficient to allow processing of the element, and the adhesion increases upon exposing the element to actinic radiation through the support.

SUPPORT

The support can be a self-supporting polymeric film substrate. By the term "self-supporting" it is meant that the film does not have to be supported by a web or other carrier. The substrate can contain almost any polymeric material that forms films which are (a) translucent or transparent to actinic radiation, (b) dimensionally stable, and (c) which are non-reactive and remain stable throughout the processing conditions. Examples of suitable films include cellulosic films and thermoplastic materials such as polyolefins, polyamides, polycarbonates and polyester. Linear polyesters are preferred, particularly polyethylene terephthalate (PET). Other linear, crystalline polyester films can also serve as the base film support, including, for example, ethylene glycol polyesters of isophthalic acid, naphthalenic acid, or mixtures of terephthalic and naphthalenic and/or isophthalic acids, or polyesters of other glycols, especially of butanediol, 1,4-cyclohexane dimethanol or mixtures of ethylene glycol with butanediol.

For purposes of this invention, the term "film" encompasses polymeric substrates such as those identified above, as well as sheet tapes, disks and similar commercial articles. The support generally has a thickness of about 0.25 to about 15 mils (6 to 375 micrometers).

THERMALLY HARDENED LAYER

The thermally hardened layer contains a polymeric material which is the reaction product of (i) either a polymer having reactive segments and nonreactive segments, i.e., segments having low adhesive properties and no reactive groups, or a blend of polymers wherein at least one polymer has reactive segments and at least one polymer has nonreactive segments, (ii) a crosslinking agent and (iii) a catalyst.

The polymer having reactive segments and nonreactive segments is generally a block copolymer. The reactive and/or nonreactive segments can be present in the polymer backbone or in the form of pendant groups. The reactive segment contains groups capable of reacting with the crosslinking agent and provides much of the adhesive function for the thermally hardened layer. Examples of suitable reactive functional groups include, but are not limited to, carboxyl, hydroxyl, amine, amide or oxirane groups. Examples of polymers which can be used as the reactive segment include polycarbonates; polymers and copolymers of unsaturated acids and anhydrides such as acrylic acid, methacrylic acid, maleic anhydride and highly carboxylated polyolefins; polyvinyl alcohol and partially hydrolyzed polyvinyl acetate; hydroxy or amino substituted polyacrylates and polymethacrylates; polyacrylamide; and epoxy polymers. The reactive segment can also be incorporated as a polymeric side chain on, for example, a polyolefin or vinyl polymer. The reactive groups generally comprise about 0.01 to 5.0% by weight based on the total weight of the reactive segment, although higher levels can be used.

The segment having low adhesive properties, i.e., the nonreactive segment, can be present as a polymeric block in a block copolymer with one of the reactive segments discussed above, or as a pendant polymeric chain. Any of those materials known for their low adhesive properties can be used. Examples of such materials include organosiloxane polymers, polyolefins and fluoropolymers. A preferred segment having low adhesion is an organosiloxane polymer.

In some cases, the nonreactive segments will contain small amounts of groups which are nominally "reactive." However, when such groups are present in very low amounts the segment still functions as nonreactive. An example of such material is a polyethylene which is partially oxidized to produce a low level of carboxyl groups, e.g., with an acid number of less than 25. Such a material does not provide good adhesion between a film support and a photohardenable layer. To determine whether a polymeric material will function as a "nonreactive segment," the material is tested without additional reactive segments. A thermally hardened layer is formed on a support from a composition containing the polymeric material to be tested, a crosslinking agent and a catalyst. A photohardenable layer is then applied over the coated support and the adhesion is determined before and after exposure through the support. If the adhesion is initially low and does not increase with exposure, then the polymeric material tested is considered to be nonreactive.

The organic polymer and the different segments are prepared using well-known polymerization techniques. The ratio of reactive to nonreactive segments can vary from about 1:9 to about 9:1, preferably about 1:3 to about 3:1 by weight. The polymer can also contain additional nonreactive blocks or pendant groups.

Alternatively, in addition to a crosslinking agent and a catalyst, the thermally hardened layer may contain a polymeric material which is a blend of two or more polymers, such that at least one polymer has reactive segments and at least one polymer has low adhesive properties and is nonreactive. Examples of suitable polymers having reactive segments include those listed above for the reactive segment in a block copolymer. Examples of suitable nonreactive polymers include those listed above for the nonreactive segment in a block copolymer. The polymers must have sufficient compatibility with each other so that a smooth continuous coating can be formed. In addition, the coating must have sufficient transparency or translucence to permit exposure of the photohardenable layer through the support and thermally hardened layer. The ratio of reactive to nonreactive polymers can vary from about 1:9 to about 9:1, preferably about 1:3 to about 3:1 by weight.

The crosslinking agent is a polyfunctional compound which will react with the reactive segment of the organic polymer in a hardening or curing step. Examples of suitable crosslinking agents include melamine-formaldehyde, urea-formaldehyde, benzoguanamine-formaldehyde, glycoluril-formaldehyde, epoxy and aziridlne resins. A preferred crosslinking agent is melamine-formaldehyde resin. The resin is used in an amount of 1 to 25% by weight, based on the weight of the organic polymer.

The catalyst functions to accelerate the crosslinking reaction. Preferred catalysts for crosslinking most formaldehyde based resins include ammonium sulfate, ammonium chloride, ammonium nitrate, ammonium thiocyanate, ammonium dihydrogen phosphate, diammonium hydrogen phosphate, para-toluene sulfonic acid, sulfuric acid, maleic acid stabilized by reaction with a base, ammonium para-toluene sulfonate and morpholinium para-toluene sulfonate. The catalyst is generally present in an amount of about 1–20% by weight based on the weight of the crosslinking agent.

The thermally hardened layer can also contain other additives as long as these do not interfere with the adhesive properties of the coating. Examples of additives which may be present include wetting agents, rheology control agents, solubility aids, surfactants, and the like. It is preferred that the thermally hardened layer's composition contain a surfactant, e.g., sodium lauryl sulfate, sodium salt of diocytl sulfosuccinate, nonylphenol polyethylene glycol ethers or ammonium lauryl ether sulfates.

In preparing the photosensitive element of the invention, the components of the thermally hardened layer are applied to the support prior to the thermal hardening step. It is preferred that the composition of the thermally hardened layer is in the form of an aqueous emulsion which is then applied to the support, i.e., the polymeric film substrate. The emulsion is prepared using standard techniques which are well known. The composition can also be applied as a solvent or semi-aqueous coating.

The aqueous emulsion or solution is applied or coated onto the polymeric film substrate using any conventional coating process. In a preferred process, the aqueous emulsion is coated onto an unstretched or uniaxially or biaxially stretched polyester film such as polyethylene terephthalate (PET). This can be accomplished, for example, by passing the polyester film through a bath of the aqueous emulsion or by applying the emulsion to one side only with a roller or a brush. The coated material is then dried. The coated film can be further stretched, if desired, and heated to a sufficient temperature to promote crosslinking of the reactive segment of the organic polymer with the crosslinking agent. Typically, a temperature of from about 150° to 250° C. is used for curing. If the coating is applied to an unstretched film, or to a unidirectionally stretched film, the film can be stretched following the coating step without compromising the mechanical integrity of the coating and then heated to a sufficient temperature to cause crosslinking. Regardless of whether the coating is applied to a stretched or unstretched film support, once the coating is dry and sufficiently cured, the end result is a support having a thermally hardened layer provided thereon. For best results, the thickness of the thermally hardened layer after drying and stretching should be about 0.01 to 1.0 micrometers, preferably 0.03 to 0.06 micrometers. The usual amount of coating material is about 0.03 to 0.06 g/m$^2$ of film surface.

PHOTOHARDENABLE LAYER

The photohardenable layer used in the photosensitive element of the invention is one which becomes less soluble, swellable or dispersible in developer solvents after exposure to actinic radiation. The term "solubility" as used herein refers to the ability of the unpolymerized areas to be removed by the action of a developer solvent following imagewise exposure and is intended to encompass swellability and dispersibility, as well as complete solubility. Photohardenable layers are usually photopolymerizable or photocrosslinkable. Photocrosslinking generally occurs by the crosslinking of a preformed polymer to form a less soluble crosslinked polymeric network. This can take place either through dimerization of pendant reactive groups attached directly to the polymer chain, or reaction of the polymer with a separate polyfunctional photoactive crosslinking agent. Photopolymerization generally occurs when relatively low molecular weight monomers or oligomers undergo photoinitiated cationic or free radical polymerization to form less soluble polymers.

A photocrosslinkable layer generally comprises a photoinitiator which is sensitive to actinic radiation and either (i) a polymeric binder having pendant reactive groups or (ii) a polymeric binder and a crosslinking agent. The photoinitiators which can be used are discussed in detail below. Materials which can be used as the binder include polymers and copolymers of acrylates, methacrylates, styrene, vinyl acetate and its partially hydrogenated derivatives. Also gelatin and cellulose esters and ethers, as well as elastomeric materials, such as polymers and copolymers of butadiene and isoprene can be used. In some systems, groups that photodimerize, such as cinnamoyl or N-alkyl stilbazolium, are attached to the polymer chain. On irradiation, groups attached to different chains dimerize to crosslink the chains. Other systems employ photoactivated crosslinking agents such as dichromate, which is used to form dichromated colloids such as dichromated gelatin, and azides. When irradiated, reactive intermediates are generated which react with two or more polymer chains to form a crosslink. Examples of photocrosslinkable systems have been disclosed, e.g., by A. Reiser in *Photoreactive Polymers* (John Wiley & Sons, New York, 1989).

A photopolymerizable layer generally comprises (i) a photoinitiator which is sensitive to actinic radiation, (ii) a monomer or oligomer which can undergo cationic or free-radical initiated polymerization, and (iii) a binder. In these systems, relatively low molecular weight monomers or oligomers are combined to form higher molecular weight polymers. This polymerization is initiated by photoactivation of the photoinitiator. The photoinitiators which can be used are discussed in detail below. Preferred monomers are ethylenically unsaturated compounds which undergo free-radical polymerization. Typical monomers include the acrylate and methacrylate esters of ethylene glycol and its low molecular weight oligomers. Polyfunctional monomers, e.g., the acrylate and methacrylate esters of trimethylol propane and pentaerythritol, are frequently used in order to form highly crosslinked networks. Esters of ethoxylated trimethyolol propane, in which each hydroxyl group has been reacted with several molecules of ethylene oxide, as well as monomers derived from bisphenol A diglycidyl ether have also been used. Materials which can be used as the binder include polymers and copolymers of acrylates, methacrylates, styrene, vinyl acetate and its partially hydrogenated derivatives. Also gelatin and cellulose esters and ethers can be used, as well as elastomeric materials, such as polymers and copolymers of butadiene and isoprene. Examples of photopolymerizable systems have been disclosed, e.g., by A. Reiser in *Photoreactive Polymers* (John Wiley & Sons, New York 1989).

It will be appreciated that in some systems both photocrosslinking and photopolymerization can occur.

Although, any of the above described photohardenable materials can be used in the photosensitive element of the invention, photohardenable materials which are suitable for the preparation of flexographic printing plates are particularly preferred and are described in greater detail below.

The photohardenable material comprises an elastomeric binder, at least one monomer and a photoinitiator. In most cases, the photoinitiator will be sensitive to visible or ultraviolet radiation. Any photohardenable compositions which are suitable for the formation of flexographic printing plates can be used for the present invention. Examples of suitable compositions have been disclosed, for example, in Chen et al., U.S. Pat. No. 4,323,637; Gruetzmacher et al., U.S. Pat. No. 4,427,759; and Feinberg et al., U.S. Pat. No. 4,894,315.

The elastomeric binder can be a single polymer or mixture of polymers which can be soluble or dispersible in aqueous, semi-aqueous or organic solvent developers. Binders which are soluble or dispersible in aqueous or semi-aqueous developers have been disclosed in Alles, U.S. Pat. No. 3,458,311; Pohl, U.S. Pat. No. 4,442,302; Pine, U.S. Pat. No. 4,361,640; Inoue et al., U.S. Pat. No. 3,794,494; Proskow, U.S. Pat. No. 4,177,074; Proskow, U.S. Pat. No. 4,431,723; and Worns, U.S. Pat. No. 4,517,279. Binders which are soluble or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen, U.S. Pat. No. 4,323,636; Heinz et al., U.S. Pat. No. 4,430,417; and Toda et al., U.S. Pat. No. 4,045,231 can be used. A preferred binder is a copolymer of styrene and butadiene, particularly a block copolymer of the A-B-A type, e.g., styrene-butadiene-styrene. It is preferred that the binder be present in at least an amount of 50% by weight of the photohardenable layer.

The term binder, as used herein, encompasses core shell microgels and blends of microgels and preformed macromolecular polymers, such as those disclosed in Fryd et al., U.S. Pat. No. 4,956,252.

The photohardenable layer can contain a single monomer or mixture of monomers which must be compatible with the binder to the extent that a clear, non-cloudy photosensitive layer is produced. Monomers that can be used in the photohardenable layer are well known in the art. Examples of such monomers can be found in Chen, U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315. Preferred monomers include the acrylate and methacrylate mono- and poly-esters of alcohols and polyols such as alkyl alcohols, hexamethylene glycol, trimethylol propane, polyoxypropyltrimethylol propane, pentaerythritol and dipentaerythritol. It is preferred that the monomer be present in at least an amount of 5% by weight of the photohardenable layer.

The photoinitiator can be any single compound or group of compounds which is sensitive to actinic radiation and generates free radicals which initiate the polymerization of the monomer or monomers without excessive termination. The photoinitiator is generally sensitive to visible or ultraviolet radiation, preferably ultraviolet radiation. It should be thermally inactive at and below 185° C. Examples of suitable photoinitiators include the substituted and unsubstituted polynuclear quinones. Examples of suitable systems have been disclosed in Gruetzmacher et al., U.S. Pat. No. 4,460,675; and Feinberg et al., U.S. Pat. No. 4,894,315. Photoinitiators are generally present in amounts from about 0.001% to about 10.0% based on the weight of the photohardenable composition.

The photohardenable layer can contain other additives depending on the final properties desired. Such additives include thermal polymerization inhibitors, plasticizers, colorants, antioxidants, antiozonants, fillers or reinforcing agents.

The photohardenable layer can be prepared in many ways by admixing the binder, the monomer, the photoinitiator and the other components. For the photosensitive elements which are used to prepare relief printing plates, it is preferred that the photohardenable mixture be formed into a hot melt and then calendered to the desired thickness. An extruder can be used to perform the functions of melting, mixing, deaerating and filtering the composition. It is further preferred that the photohardenable material be extruded through a die directly onto the coated support and treated to achieve the desired thickness. This can be accomplished by calendering the photohardenable material between the support and a cover layer, i.e., a coversheet or multilayer cover element. Calendering is accomplished by passing the photohardenable material from the mixing device or extruder into the nip of a calender and calendering while hot between the support and a cover layer.

The photohardenable material can also be placed between the coated support and a cover layer in a mold. The material is then pressed flat by the application of heat and/or pressure.

Alternatively, the photohardenable material can be applied by casting a solution of the material in a suitable solvent, onto the coated support. The photohardenable material can also be cast onto a temporary support and then laminated onto the coated support.

ADJUSTING THE ADHESION OF THE PHOTOHARDENABLE LAYER TO THE COATED SUPPORT

The initial adhesion of the photohardenable layer to the coated support depends on (a) the composition of the photohardenable layer, (b) the composition of the thermally hardened layer including the amount of crosslinking and the relative proportions of reactive segments and nonreactive segments, (c) the processing conditions used to coat and harden the thermally hardened layer, and (d) the processing conditions used to prepare the photosensitive element. The adhesion of the photohardenable layer to the coated support is increased by exposing the photosensitive element to actinic radiation through the support or polymeric film substrate.

A larger proportion of the reactive segment or reactive polymer in the thermally hardened layer results in higher initial adhesion of the photohardenable layer to the coated support. A larger proportion of the nonreactive segment results in lower initial adhesion and limits the adhesion achievable with exposure through the support. Thus, for any given set of processing conditions, the lower and upper limits on the adhesion between the photohardenable layer and the coated support are determined by the composition of the photohardenable layer and the composition of the thermally hardened layer. A change in processing conditions, e.g., a change in the cure temperature for the thermally hardened layer, the heat history of the photohardenable layer, the way in which the photohardenable layer is applied to the coated support, etc., will shift these upper and lower limits somewhat. Therefore, it is necessary to determine the adhesion under the process conditions that will actually be used.

The fine-tuning of the adhesion is accomplished by exposing the photosensitive element to actinic radiation through the support. This exposure increases the adhesion of the photohardenable layer to the coated support. The adhesion-adjusting exposure occurs before the imagewise exposure of the element, as the imagewise exposure will itself result in an increase in the adhesion between the photosensitive layer and the support. The adhesion-adjusting exposure is generally quite short in duration. In some cases, strong adhesion to the support is desired prior to the imagewise exposure step, and therefore, longer adhesion-adjusting exposure times are used. However, the adhesion-adjusting exposure should not be so long as to interfere with the development of the image. If the exposure is too long, too much of the photohardenable layer will be polymerized or crosslinked and there will not be a sufficient amount of nonhardened material to develop an image. In practicing the invention, the adhesion-adjusting exposure time will generally be up to about 30 mj/cm$^2$.

In the process for preparing flexographic printing plates from photohardenable elements, it is sometimes desirable to be able to remove large sections of the photohardenable layer which have not been exposed to actinic radiation, after the imagewise exposure step and at the same time have good adhesion of the exposed areas of the photohardenable layer to the support. This can be accomplished using the photosensitive elements of the invention. The composition of the thermally hardened layer and the length of the adhesion-adjusting exposure are chosen so that the photohardenable layer has low initial adhesion to the coated support. In the imagewise exposure step, the adhesion to the support is increased in the exposed areas, but not changed in the unexposed areas. Thus, after the imagewise exposure, the unexposed areas can still be removed from the support by cutting around the areas and peeling them off the support. This eliminates the need to wash out large areas of nonphotohardened material and simplifies waste disposal. It may also be desirable to give the element an additional exposure through the support, after the unexposed areas have been removed, to increase the adhesion of the support to the remaining photohardened areas. In general, an initial adhesion of from 0.1 to 2.0 pli (0.018 to 0.35 N/mm) is acceptable for such applications.

The adhesion-adjusting exposure can take place just prior to the imagewise-exposure step. However, it is preferred that it be carried out during the manufacturing process for the photosensitive element. As the photohardenable layer is applied to the coated support, by an extrusion/calendering process, a lamination process or a coating process, the element can be passed over a bank of lights which provide the actinic radiation. The exposure time will vary depending upon the intensity and spectral energy distribution of the radiation, its distance from the photosensitive element, and the nature and amount of the photosensitive composition. Typically, the photosensitive compositions are sensitive to ultraviolet radiation. The radiation source should furnish an effective amount of this radiation, preferably having a wavelength range between about 250 nm and 500 nm. In addition to sunlight, suitable radiation sources include carbon arcs, mercury-vapor arcs, fluorescent lamps, lasers, electron flash units and photographic flood lamps. Mercury-vapor lamps, UV fluorescent tubes, and particularly sun lamps, are most suitable.

The photosensitive elements of the invention can be used to form images and are particularly useful to form relief images that are used as printing plates. In general, the process of preparing a flexographic printing plate from a photohardenable element includes the steps of main image exposure, development or washout, and post-development treatment. Post-development treatment can include any or all of the following: drying, overall post-exposure and surface detackification. In applications where strong adhesion of the photohardenable layer to the support is desired and where nonhardened areas will not be peeled off the support, a backflash exposure may also be used prior to the imagewise exposure step. The backflash exposure step is distinct from the adhesion-adjusting exposure step in that the exposure time required to effectively carry out the backflash is significantly longer (generally, two or three minutes versus a few seconds). Furthermore, the backflash exposure step is intended to photoharden the binder and monomer in the support region to create a "floor". Thus, the backflash exposure step serves to sensitize the plate and establishes the depth of the plate relief.

Following imagewise exposure, the image can be developed by washing with a suitable developer. Solvent development is usually carried out at room temperature. Suitable developer solvents for the compositions described above include aromatic or aliphatic hydrocarbon or halohydrocarbon solvents, for example, perchloroethylene, 1,1,1-trichloroethane, tetrachloroethane, trichloroethylene, benzene, toluene, xylene, hexane, isononylacetate, methylisobutylketone, or mixtures of such solvents with suitable alcohols. Other organic solvent developers have been disclosed in published German Application No. 3828551.

The advantageous properties of this invention can be observed by reference to the following examples which illustrate, but do not limit, the practice of the invention. Unless otherwise stated, all parts and percentages are by weight.

EXAMPLES

GLOSSARY

| | |
|---|---|
| BHT | Butyrated hydroxy toluene |
| Binder I | Styrene-butadiene-styrene block copolymer; Kraton ® 2105; Shell Chemical Co., Houston, TX |
| Binder II | Styrene-butadiene block copolymer; Cariflex ® DX-1000; Shell Chemical Co., Houston, TX |
| Crosslinker | Hexamethoxy melamine formaldehyde resin; Cymel ® 301; American Cyanamid, Wayne, NJ |
| DMAE | Dimethylamino ethanol |
| HMDA | Hexamethylenediol diacrylate |
| IPA | Isopropanol |
| Photoinitiator | 2-phenyl-2,2-dimethoxy acetophenone |
| Polyoil | 1,4-Polybutadiene, MW 3000 |
| Red dye | Neozapon ® Red dye; BASF Wyandotte Corp., Holland MI |
| Rheology Control Agent | 50% solution in alcohol of a vinylpyrrolidone/vinyl acetate copolymer (50/50); GAF, New York, NY |
| Stabilizer | 1,4,4-Trimethyl-2,3-diazobicyclo(3.2.2)-non-2-ene-2,3-dioxide |
| Surfactant | 75% active solution of the sodium salt of dioctyl sulfosuccinate; Aerosol ® OT-75; American Cyanamid, Wayne, NJ |

PREPARATION OF A PHOTOSENSITIVE ELEMENT

The photosensitive elements described in the following examples were prepared according to the following procedure:

A cast polyethylene terephthalate film such as Mylar® was stretched in the machine direction and corona treated. An aqueous emulsion of the coating, identified in each example, was then applied to the film by roller coating. The coating was dried at 70° C. for four seconds. The coated film was subsequently stretched in the transverse direction. The film was heat set at 220° C. for two seconds to promote adhesion and to cure the coating composition. The final coating thickness was 0.035 micrometers and the final film thickness was 1 mil (25 micrometers).

A photohardenable layer was prepared having the following composition:

| Component | Parts (by weight) |
|---|---|
| Binder I | 61.5 |
| Binder II | 10.5 |
| Polyoil | 19.4 |
| HMDA | 6.5 |
| Initiator | 1.4 |
| Red dye | 0.006 |
| HEMA | 0.234 |
| BHT | 0.5 |
| Stabilizer | 0.02 |

The components for the photohardenable composition were fed into a 30 mm twin screw extruder and extruded at 182° C. between the coated polyester support prepared above and a polyethylene terephthalate coversheet coated with a thin polymeric film of polyamide, such that the polyamide layer was adjacent to one side of the photohardenable layer. The coversheet had a thickness of 5 mils (0.013 cm) and the polyamide coating had a coating weight of 40 mg/dm². The total thickness, excluding the cover sheet, was 150 mils (0.381 cm).

ADHESION TEST

The photosensitive elements were exposed to ultraviolet radiation through the coated Mylar® support using a Cyrel® 30×40 exposure unit (E. I. du Pont de Nemours & Co., Wilmington, Del.). A Tedlar filter was used to reduce the intensity to a level similar to that which would be given in an on-line manufacturing process. The time of the exposure varied as shown in Table 1. The resulting adhesion of the photohardenable layer to the coated Mylar® support was measured using an Instron Model 4201 using 1-inch (2.54 cm) strips peeled at 10 inches per minute (25.4 cm per minute).

EXAMPLE 1

This example illustrates the photosensitive element of the invention in which the support was coated with a polymeric compound having segments with reactive functionality and segments with low adhesive functionality.

The polymer used was Permuthane UE-41222, supplied by Permuthane Coatings (Peabody, Mass.), as a 30% solids emulsion in water. Permuthane UE-41222 is a polycarbonate-silicone-urethane resin, which is carboxy-functional. The coating had the following composition:

| Component | Amount (g) |
| --- | --- |
| Polymer emulsion | 3626.0 |
| Crosslinker | 81.7 |
| Ammonium sulfate | 4.1 |
| Rheology control agent | 13.2 |
| IPA | 67.4 |
| DMAE | 40.0 |
| Surfactant | 3.6 |
| Water to make 10.8 kg | |

The adhesion of the photohardenable layer to the coated support is provided in Table 1.

EXAMPLE 2

This example illustrates the test to determine whether a material functions as "nonreactive".

The material to be tested was a partially oxidized polyethylene having an acid number of 16. The polymer was in the form of a 30% solids aqueous emulsion to which KOH had been added to a pH of 10.

A solution was made with the following components:

| Component | Amount (g) |
| --- | --- |
| Crosslinker | 42.3 |
| Ammonium lauryl sulfate | 61.8 |
| IPA | 70.2 |
| DMAE | 9.0 |
| Water to 300 g | |

The solution was diluted to 1 gallon (4.55 l) with water and then 30 g of the following solution was added:

| Component | Amount (g) |
| --- | --- |
| Ammonium sulfate | 127.2 |
| DMAE | 150.0 |
| Water to 1800 g | |

To this was added 2826 g of the 30 weight % polyethylene emulsion followed by enough water to bring the weight of the bath to 11.3 kg. This coating material was used to coat the support for a photosensitive element and tested for adhesion as described above.

The adhesion of the photohardenable layer to the coated support after 0, 2, 3 and 5 seconds exposure through the support was 0.005, 0.08, 0.08 and 0.05 pli, respectively. Because the adhesion started at a very low level, which was maintained even after exposure, the polyethylene was considered to be "nonreactive."

EXAMPLE 3

This example illustrates the photosensitive element of the invention in which the support was coated with a blend of two polymers, i.e., a polymer having reactive functionality and a polymer having low adhesive functionality.

The polymer with reactive functionality was a copolymer of methyl methacrylate/ethyl acrylate/methacrylamide. The copolymer was in the form of a 46% solids aqueous emulsion. The emulsion also contained 25% by weight melamine formaldehyde resin, based on the solids weight of acrylic copolymer, and 3% by weight triethylamine.

The polymer with low adhesive functionality was the partially oxidized polyethylene having an acid number of 16 as used in Example 2. The polymer was in the form of a 30% solids aqueous emulsion to which KOH had been added to a pH of 10.

A catalyst solution was prepared from the following components:

| Component | Amount (g) |
| --- | --- |
| Crosslinker | 21.2 |
| Ammonium lauryl sulfate | 30.9 |
| DMAE | 10.0 |
| Ammonium sulfate | 1.06 |
| Water to 453 g | |

The coating for the polyester support was prepared from the following components, which were added in order:

| Component | Amount (g) |
| --- | --- |
| Acrylic copolymer | 921 |
| Water | 4530 |
| Polyethylene | 1413 |
| Catalyst solution from above | |
| Water to 11.3 kg | |

The adhesion of the photohardenable layer to the support is provided in Table 1.

COMPARATIVE EXAMPLES 1–2

These examples illustrate photosensitive elements in which the support was coated with a polymer with low adhesive functionality.

COMPARATIVE EXAMPLE 1

In this example the coating was a silicone polymer having low adhesive functionality. The silicone was prepared from an aqueous emulsion of a crosslinkable silicone, Dehesive™ Silicone 1571E, a crosslinking agent with platinum catalyst, Crosslinking Agent 1572, and an anchorage additive, HF-86, all supplied by Wacker Silicones Corp. (Adrian, Mich.).

The following solution was prepared:

| Component | Amount (g) |
|---|---|
| Dehesive ™ 1571 | 3654 |
| Crosslinker 1572 | 544 |
| Water to 13.3 kg | |

The coating for the polyester support was made by adding 122.6 g of HF-86 to 11.3 kg of the above solution.

The adhesion of the photohardenable layer to the coating support is provided in Table 1.

COMPARATIVE EXAMPLE 2

In this example, a polyester support was coated with a fluoropolymer having low adhesive functionality. The fluoropolymer used was an aqueous emulsion of Zonyl® 7040 supplied by E. I. du Pont de Nemours & Co., Wilmington, Del.

Water was added to 7.0 kg of Zonyl® to make 12.7 kg. To make the final coating solution, 380 g of a 7.5% aqueous dispersion of colloidal silica was then added to 11.3 kg of the diluted Zonyl® solution.

The adhesion of the photohardenable layer to the coating support is provided in Table 1.

TABLE 1

| Example | Exposure (sec) | Adhesion (pli)[a] |
|---|---|---|
| 1 | 0 | 0.5 |
| 1 | 2 | 0.6 |
| 1 | 3 | 0.7 |
| 1 | 5 | 0.9 |
| 3 | 0 | 0.9 |
| 3 | 2 | 1.3 |
| 3 | 3 | 1.4 |
| 3 | 5 | 1.6 |
| Comparative 1 | 0 | (a)[b] |
| Comparative 1 | 2 | (a) |
| Comparative 1 | 3 | (a) |
| Comparative 1 | 5 | (a) |
| Comparative 2 | 0 | 0.02 |
| Comparative 2 | 2 | 0.20 |
| Comparative 2 | 3 | 0.30 |
| Comparative 2 | 5 | 0.25 |

[a] pounds per linear inch
[b] (a) = adhesion too low to measure

The results in Table 1 show that the photosensitive elements of the invention, i.e., the elements prepared in accordance with Examples 1 and 3, have adhesion which is increased upon exposure to actinic radiation through the support. In the Comparative Examples, the adhesion begins at a very low level and that level of adhesion is maintained even after exposure.

EXAMPLE 4

A photohardenable material having the composition given above was pressed in a mold between a 5 mil (0.013 cm) polyethylene terephthalate support coated with an adhesion-adjusting material and a polyester coversheet coated with a polyamide film layer, to produce a final total thickness of 112 mils (0.284 cm), not including the coversheet. The polymeric compound was the same as that described in Example 1, i.e., Permuthane UE-41222. The photosensitive element thus prepared was exposed through the polyester support as described above. The results are provided in Table 2 below.

COMPARATIVE EXAMPLE 3

The procedure in Example 4 was repeated except that uncoated polyethylene terephthalate with a thickness of 5 mils (0.013 cm) was used as the support. The results are provided in Table 2 below.

TABLE 2

| Example | Exposure (sec) | Adhesion (pli) |
|---|---|---|
| 4 | 0 | 0.8 |
| 4 | 3 | 1.0 |
| 4 | 5 | 1.1 |
| 4 | 7 | 1.3 |
| Comparative 3 | 3 | 1.6 |
| Comparative 3 | 5 | 1.6 |
| Comparative 3 | 7 | 1.5 |

EXAMPLE 5

This example illustrates the effect of the initial adhesion-adjusting exposure on the initial adhesion and on the adhesion after imagewise exposure and development.

A photosensitive element was prepared as described in Example 1, except that a 5 mil (0.013 cm) polyester support was used. Samples of the element were given different initial adhesion-adjusting exposures as indicated below. The elements were then processed to produce flexographic printing elements in a standard manner. The elements were given a backflash exposure to UV radiation through the support for 90 seconds on a Cyrel® 30×40 exposure unit. The elements were then given an imagewise exposure through a phototool in the same exposure unit for 15 minutes. The exposed plate samples were washed for 15 minutes in a Cyrel® 30×40 rotary processor using tetrachloroethylene/n-butanol (75/25 volume percent) as the developing solvent. The sample plates were then dried in an oven at 60° C. for two hours. Following drying, the sample plates were detackified and post-exposed for 10 minutes in a Du Pont Cyrel® Light Finish/Post Exposure unit.

The adhesion was measured using a 3 cm strip and peeling at a rate of 10 cm/minute. The adhesion values after the adhesion-adjusting exposure (raw adhesion) and after development (developed adhesion) are provided in the table below.

TABLE 3

| Adhesion Adjusting Exposure[a] | Raw Adhesion (g) | Developed Adhesion (g) |
|---|---|---|
| 0 | 350 | 900 |
| 8.1 | 360 | 1045 |
| 8.6 | 400 | 1135 |
| 9.6 | 400 | 1090 |
| 10.2 | 450 | 1135 |
| 11.6 | 450 | 1225 |
| 12.7 | 500 | 1275 |
| 22.8 | 1000 | np |

[a] the exposure was in mj/cm$^2$
np = not peelable; the adhesion was too great to peel the sample apart.

EXAMPLE 6

This Example illustrates the effect of the initial adhesion-adjusting exposure on the final plate adhesion, when the element is given a back-exposure as the last processing step.

Samples of a photosensitive element were prepared as in Example 5 and given initial adhesion-adjusting exposures as shown below. The samples were processed using the same exposure and development equipment and same development solvent as in Example 5. The samples were first given an imagewise exposure for 15 minutes, developed for 15 minutes, dried for two hours, and detackified and post-exposed for 10 minutes. The samples were then given a 10 minute back exposure.

The adhesion was measured on a 3 cm strip at a peel rate of 10 cm/minute. The results are provided in the table below.

TABLE 4

| Adhesion Adjusting Exposure[a] | Developed Adhesion (g) |
| --- | --- |
| 0 | 820 |
| 8.1 | 2700 |
| 8.6 | 3500 |
| 11.6 | np |

[a] the exposure is in mj/cm$^2$
np = not peelable; the adhesion was too great to peel the sample apart

What is claimed is:

1. A process for preparing a flexographic printing plate comprising
   (A) imagewise exposing a photosensitive element containing in order:
   (1) a support;
   (2) a thermally hardened layer containing the reaction product of
      (i) either an organic polymer having reactive segements and nonreactive segments or a blend of organic polymers wherein at least one polymer has reactive segments and at least one polymer has nonreactive segments,
      (ii) a crosslinking agent, and
      (iii) a catalyst; and
   (3) a photohardenable layer
   (B) applying a washout developer to the exposed element;
   (C) drying the plate; and
   (D) post-exposing the resulting plate;
   wherein prior to the imagewise exposure step (A), the adhesion of the photohardenable layer to the thermally hardened layer is increased by exposing the photosensitive element to ultraviolet radiation, having a wavelength range between about 250 nm and 500 nm, through the polymeric film substrate.

2. The process of claim 1 wherein the support consists essentially of a transparent polymeric film.

3. The process of claim 1 wherein the photohardenable layer consists essentially of a photopolymerizable material containing an elastomeric binder, at least one monomer and a photoinitiator.

4. The process of claim 1 wherein the photohardenable layer consist essentially of a photocrosslinkable material containing a photoinitiator, and a polymeric binder having pendant reactive groups.

5. The process of claim 1 wherein the photohardenable layer consist essentially of a photocrosslinkable material containing a photoinitiator, a polymeric binder and a crosslinking agent.

* * * * *